United States Patent [19]

Bert et al.

[11] 4,311,970

[45] Jan. 19, 1982

[54] MICROWAVE, SOLID-STATE, STABILIZED OSCILLATOR MEANS

[75] Inventors: Alain Bert; Bernard Le Clerc, both of Paris, France

[73] Assignee: Thomson-CSF, Paris, France

[21] Appl. No.: 73,854

[22] Filed: Sep. 10, 1979

[30] Foreign Application Priority Data

Sep. 15, 1978 [FR] France .................. 78 26553

[51] Int. Cl.³ .............................. H03B 5/12
[52] U.S. Cl. ..................... 331/107 R; 331/96
[58] Field of Search ........... 331/107 DP, 101, 96, 331/99, 107 R, 107 G, 107 T

[56] References Cited

U.S. PATENT DOCUMENTS 3,714,605  1/1973  Grace et al. ............... 331/101
3,866,144  2/1975  Sawayama et al. ......... 331/107 DP Primary Examiner—David K. Moore
Attorney, Agent, or Firm—Roland Plottel

[57] ABSTRACT

Stabilization on a desired frequency fo of a solid-state oscillator is obtained by means of an additional damping load 6 preventing oscillations outside a narrow band about this frequency. In order to prevent losses in said load, the load in question is cut out at frequency fo by a stop band filter 7 mounted in the transmission line to which is connected the oscillator, a negative resistance diode 4, arranged in series with the load and terminated on a reactive impedance. Realization may be carried out by way of microband technology for devices operating at 10 gigahertz with an output power of several watts.

3 Claims, 6 Drawing Figures

MICROWAVE, SOLID-STATE, STABILIZED OSCILLATOR MEANS

BACKGROUND OF THE INVENTION

The invention relates to a solid-state radio-electric oscillator for the microwave range. It more specifically relates to the complete apparatus constituted by the actual oscillator and the means associated therewith for eliminating parasitic oscillations which could occur on frequencies other than the desired frequency and in particular harmonic frequencies. The actual oscillator is constituted by a Gunn or avalanche-type negative resistance diode.

Assemblies are known (cf particularly MAGALHAES and KUROKAWA Proc. IEEE 1970, 58, pp 831–832) in which said elimination, i.e. the stabilisation of the assembly on the desired operating frequency, is brought about by means of a damping load, which may or may not differ from the useful load. However, in such known assemblies the damping load generally absorbs part of the power produced when operating on the desired operating frequency, thus reducing, under otherwise identical conditions, the output power of the apparatus.

BRIEF SUMMARY OF THE INVENTION

The present invention relates to a microwave oscillator in which this disadvantage is eliminated. In the apparatus according to the invention a damping load is admittedly used, but means are provided for cutting out this damping load when the operating frequency is reached. Thus, the presence of this load, whilst ensuring the damping of parasitic oscillations around the operating frequency, has no significant influence on the output level of the apparatus at this frequency. Its elimination improves the noise signal factor due to the improvement to the Q factor resulting therefrom.

BRIEF DESCRIPTION OF THE DRAWINGS

The invention will be better understood from the following description, with reference to the drawings, wherein show.

DETAILED DESCRIPTION OF THE PREFERRED EMBODIMENTS

Figure 1:
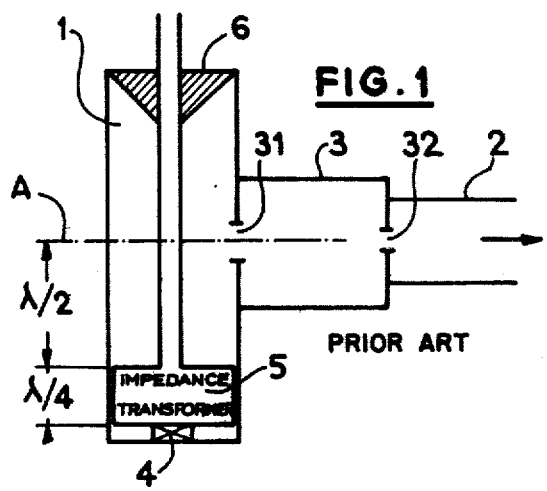
FIG. 1, the general diagram of a prior art, frequency-stabilised diode oscillator.

In order to facilitate comprehension of the invention one of the prior art microwave diode stabilised oscillators is described hereinafter with reference to FIGS. 1, 2, 3 and 4.

A frequency-regulatable high Q factor cavity 3 which is resonant at frequency fo is coupled by irises 31 and 32 to a first coaxial supply line 1 and a second supply line 2, terminated on a not shown useful load located to the right of the limits of the drawing (see arrow). Coupling factors $m_1$ and $m_2$ respectively correspond to the said irises. The coaxial structure contains the solid-state oscillator 4 which, as stated hereinbefore, comprises a negative resistance diode with which are associated, although not shown because they belong to the prior art, the means necessary for starting radioelectric frequency oscillations with the same. At 5 is shown a $\lambda/4$ impedance transformer (the letter $\lambda$ designates the wavelength corresponding to the desired operating frequency fo of the system) of the type well known in the microwave field. The drawing shows iris 31 at $\lambda/2$ of the output of transformer 5. Reference numeral 6 designates the damping load terminating the coaxial line 1.

Figure 2:
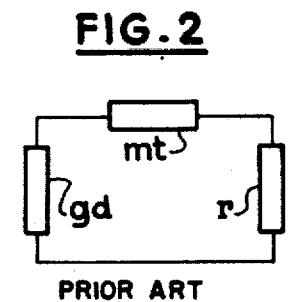
FIGS. 2 and 3, explanatory diagrams relating to the oscillator of FIG. 1.

In such a system frequency stabilisation is brought about in the following manner. Out of resonance the impedance in the coaxial line level with the input of transformer 5, i.e. level with the upper line in rectangle 5, is equal to r, r designating the impedance of load 6 equal to the characteristic impedance of the coaxial line, and also to unity if consideration is given in the manner indicated hereinafter to the reduced impedance, measured by taking the characteristic impedance of coaxial line 1 as unity, Loaded in this way diode 4 does not oscillate after transformation by element 5. However, at resonant frequency fo to said impedance is added the impedance transmitted by cavity 3 loaded with the useful load and coupled to line 1 by successive irises 31 and 32. The new impedance in reduced value is of the form $$m_t = \frac{m_1}{1 + m_2}$$

and the circuit equivalent to the oscillator at frequency fo is in the form shown in FIG. 2, showing in series loads $m_t$ and r level with the input of transformer 5, $g_d$ representing the impedance of diode 4 at this level.

Figure 3:
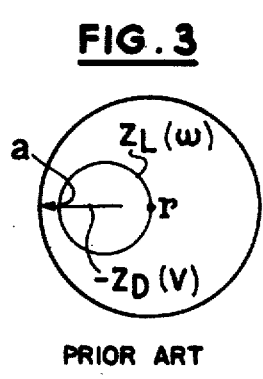

FIG. 3 is the representation on a Smith diagram of the impedance of the total load of the circuit, $Z_L(\omega)$ ($\omega = 2\pi$), (dependent on the operating frequency fo by the part resulting from the presence of cavity 3) level with the active element 4 of impedance $Z_D(V)$, V being the high voltage frequency level with the diode. Oscillation occurs for $Z_L = -Z_D$ (point a in the diagram); this being so it should be noted that at frequency fo the oscillation energy supplied by the diode is distributed between the cavity and the useful load on the one hand and the damping load on the other in a ratio $m_t/r$. Thus, the energy dissipated in the damping load 6 is lost. To reduce this loss it has been proposed to reduce the value of r to the maximum with the aid, for example, of an impedance transformer (see R. KNOCKEL, K. SCHUNEMANN; Electronics Letters 1977, 13, No 19, 83).

According to the invention this value is reduced virtually to zero by adding a frequency-selective filter to the damping load 6 under conditions to be defined hereinafter. This filter is centred on frequency fo. But, whilst in prior art (see U.S. Pat. No. 4,034,314) this filter is arranged in parallel with the damping load 6 in the transmission line 1, in the invention it is mounted in series with the same.

Figure 4:
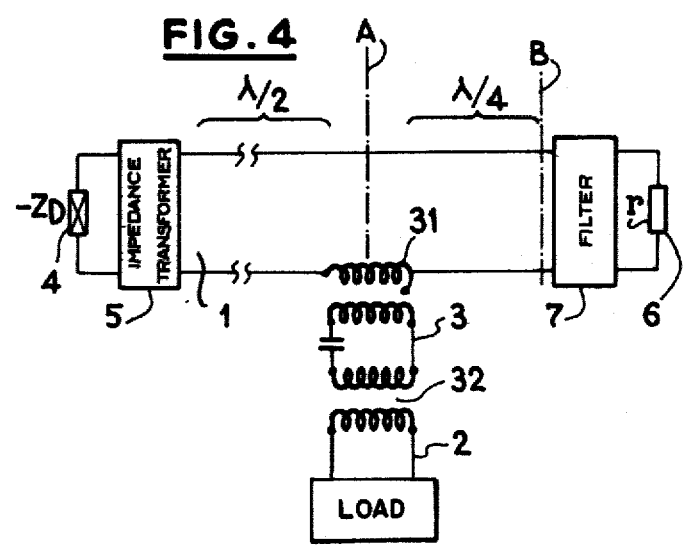
FIGS. 4 and 5, the electrically equivalent diagrams of a stabilised diode oscillator according to the invention.

According to this prior art a stop band filter is inserted between the iris 31 for coupling cavity 3 to the coaxial line 1 and the damping load 6. The equivalent circuit of the apparatus is then in accordance with FIG. 4 in which the same reference numerals designate the same elements as in FIG. 1. In FIG. 4 reference 7 is the stop band filter of the device. A designates the median plane of the coupling iris of cavity 3, the latter being represented by the resonant circuit equivalent thereto, coupled to line 2 by mutual action. In the example of FIG. 4 plane B is separated from iris A by a line section of length λ/4 (or an uneven multiple of λ/4), A designating the wavelength corresponding to frequency fo. As a result of the presence of filter 7 at resonance, i.e. at frequency fo, the impedance of line 1 is infinite in plane B and zero at level A of the coupling iris. Thus, at the input of transformer 5, separated from plane A by a line length λ/2 (or a multiple of λ/2), the total load impedance is reduced to quantity $m_r$ of FIG. 2 and, at resonance, the loss in the damping load r is virtually cancelled out. All the power produced is then absorbed by the load terminating line 2.

Figure 5:
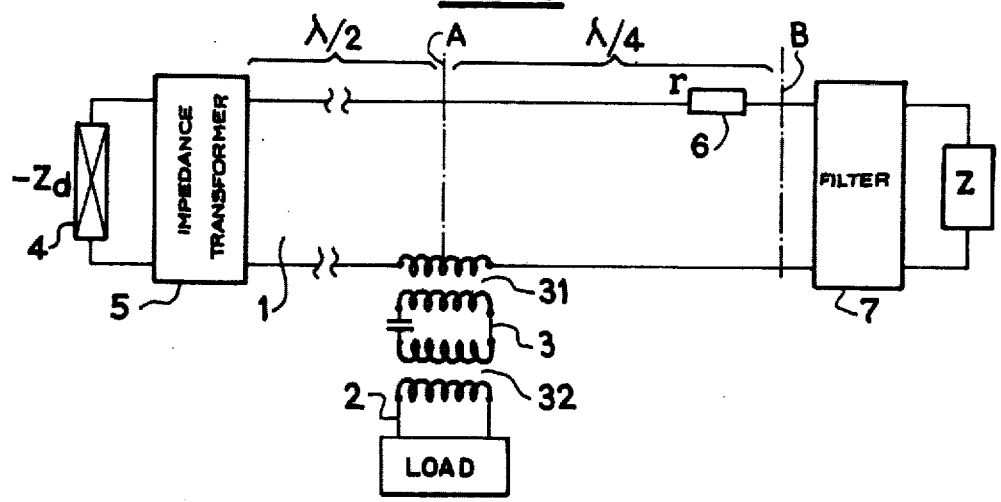

Contrary to this prior art in the apparatus according to the invention, filter 7 is arranged in series with the damping load and iris 31. It is terminated on a reactive impedance Z, as shown in FIG. 5. At resonance fo the line behaves like a circuit open in plane B and terminated on a zero impedance in plane A, separated from plane B by a section of length λ/4. The conclusion is the same as in the previous case.

In the embodiments of FIGS. 4 and 5 plane B is an infinite impedance plane of line 1 at the output of filter 7. In the case where this output corresponds with a zero impedance plane it is obvious that, in accordance with the known practice, the distance AB would be equal to a multiple of λ/2.

Figure 6:
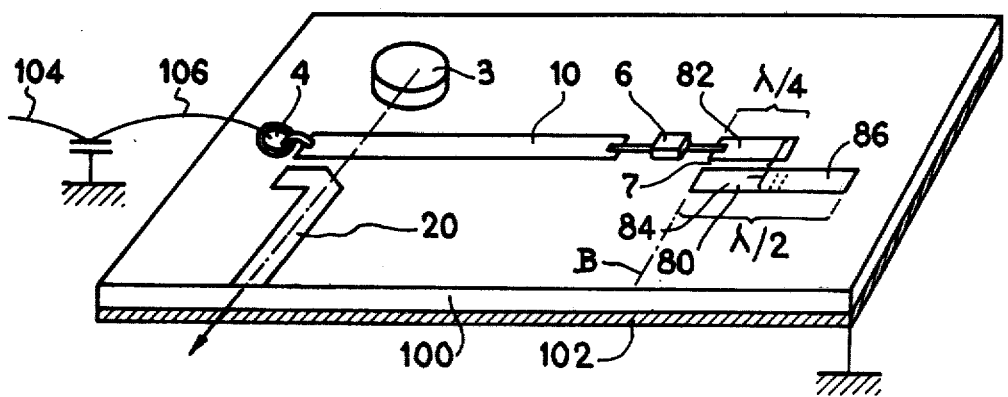
FIG. 6, an embodiment of a stabilised diode oscillator according to the invention.

FIG. 6 shows an embodiment of the apparatus according to the invention in the variant of FIG. 4 using "microband" technology, in which the elements constituting the microwave circuits are conductors deposited on an insulating substrate, made for example of silica or alumina, one face of which is covered with an electricity-conducting coating.

The substrate in question is given the reference numeral 100 and the conducting coating covering one of its faces the reference numeral 102.

In this technology each of the constituent elements consists of the conductive deposit and the part of the conductive coating facing the latter on the opposite face of the substrate. In particular metal strip 10 is one of the conductors of coaxial line 1 of the previous drawings, the other conductor being base plate 102.

In this embodiment cavity 3 is a dielectric resonator. In this drawing the same reference numerals designate the same members as in the previous drawings. The technology used is well known in microwave field and reference will only be made to certain particularly important points.

Load 6 is connected to filter 7 constituted by a section 80 of two coupled lines 82 and 84 of length λ/4, one of which is connected to load 6 by one of its ends and open at the other, and whereof the other line is open at one of its ends and is closed on a section of line 86 of length λ/4, as shown in the drawing.

In accordance with the prior art diode 4 is supplied by a not shown source via a conductor 104 and a neutralizing capacitor 106.

By using such a filter it is easily possible to obtain a 2% rejection band. The damping load is also realised by a metal deposit on substrate 100, but according to other embodiments of the invention it can also be of the hybrid type. Cavity resonator 3 is a known dielectric resonator comprising a solid cylinder made from one of the conventionally used materials, namely a mixture of oxides of materials such as titanium and tin. It is placed on substrate 100 in reflection with respect to line 10; its median plane (dot-dash line) is approximately λ/4 from the end thereof. It could equally, according to the invention, be disposed in transmission between conductors 10 and 20.

It should finally be noted that without passing beyond the scope of the invention the stop band filter, whose microband technology structure has been given, could be produced in coaxial form with the same results.

Using constructions as described with respect to FIG. 6 powers of a few watts have been obtained at 10 gigahertz without any significant power dissipation in the damping load at system resonance.

The apparatus according to the invention has the same applications as in the prior art, particularly as local oscillator in radar systems.

The invention is not limited to the embodiment described and represented hereinbefore and various modifications can be made thereto without passing beyond the scope of the invention.

What is claimed is:

1. A microwave solid state oscillator comprising a negative resistance diode and associated with the latter means for producing radioelectric oscillations within the diode, means for coupling the diode to one end of a supply line, a cavity resonator coupled to said line and resonating on a frequency $f_o$, a useful load and a damping load and a stop-band filter being connected to said line, said loads and filter being mounted in series on the line as viewed from said coupling, and said filter being equivalent to an infinite impedance at $f_o$ frequency and a very weak one outside a given band round $f_o$.

2. An oscillator means according to claim 1, wherein the stop band filter comprises a section of two interconnected lines of length λ/4, λ designating the wave length corresponding to the frequency fo, one of said lines being connected at one of its ends to the damping load, said damping load being connected at its other end of the supply line which is coupled the diode, and said one line being open at its other end, the other line is open at one of its ends and is terminated at the other end on a section of open line of length λ/4, the cavity resonator being composed of a dielectric resonator coupled to the supply line in the vicinity of its end coupled to the diode, and coupling means of the useful load to the supply line.

3. An oscillator means according to claim 2, wherein the lines and supply lines are composed of linear conductor portions applied to the face of an electrically insulating substrate covered on its opposite face by an electricity conducting coating, and wherein the dielectric resonator is placed on the substrate.

* * * * *